United States Patent
Su et al.

(10) Patent No.: US 10,685,159 B2
(45) Date of Patent: Jun. 16, 2020

(54) ANALOG FUNCTIONAL SAFETY WITH ANOMALY DETECTION

(71) Applicant: Intel Corporation, Santa Clara, CA (US)

(72) Inventors: Fei Su, Ann Arbor, MI (US); Prashant Goteti, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 16/020,396

(22) Filed: Jun. 27, 2018

(65) Prior Publication Data

US 2019/0050515 A1    Feb. 14, 2019

(51) Int. Cl.
| | |
|---|---|
| *G06F 11/00* | (2006.01) |
| *G06F 30/367* | (2020.01) |
| *G01R 31/3163* | (2006.01) |
| *G06N 20/00* | (2019.01) |
| *G01R 31/00* | (2006.01) |
| *G06F 30/15* | (2020.01) |

(52) U.S. Cl.
CPC ......... *G06F 30/367* (2020.01); *G01R 31/007* (2013.01); *G01R 31/3163* (2013.01); *G06N 20/00* (2019.01); *G06F 30/15* (2020.01)

(58) Field of Classification Search
None
See application file for complete search history.

(56) References Cited

U.S. PATENT DOCUMENTS

| | | | |
|---|---|---|---|
| 10,335,962 B1* | 7/2019 | Rosenberg | ........... B25J 19/0095 |
| 2009/0100050 A1* | 4/2009 | Erol | ................... G06K 9/00463 |
| 2010/0076698 A1* | 3/2010 | He | .......................... F23N 5/242 |
| | | | 702/35 |

(Continued)

FOREIGN PATENT DOCUMENTS

| | | |
|---|---|---|
| CN | 110647414 A | 1/2020 |
| DE | 102019112734 A1 | 1/2020 |

OTHER PUBLICATIONS

"Guidelines for Part Average Testing", Automotive Electronics Council Component Technical Committee AEC—Q001 Rev-D, (Dec. 9, 2011), 12 pgs.

(Continued)

*Primary Examiner* — Mujtaba M Chaudry
(74) *Attorney, Agent, or Firm* — Schwegman Lundberg & Woessner, P.A.

(57) ABSTRACT

In some examples, systems and methods may be used to improve functional safety of analog or mixed-signal circuits, and, more specifically, to anomaly detection to help predict failures for mitigating catastrophic results of circuit failures. An example may include using a machine learning model trained to identify point anomalies, contextual or conditional anomalies, or collective anomalies in a set of time-series data collected from in-field detectors of the circuit. The machine learning models may be trained with data that has only normal data or has some anomalous data included in the data set. In an example, the data may include functional or design-for-feature (DFx) signal data received from an in-field detector on an analog component. A functional safety action may be triggered based on analysis of the functional or DFx signal data.

22 Claims, 12 Drawing Sheets

(56) References Cited

U.S. PATENT DOCUMENTS

| | | | | |
|---|---|---|---|---|
| 2010/0102840 | A1* | 4/2010 | Ueda | G01R 31/31905 324/756.01 |
| 2011/0153236 | A1* | 6/2011 | Montreuil | G01R 19/2513 702/59 |
| 2016/0282885 | A1* | 9/2016 | Unni | G05B 23/0227 |
| 2017/0132068 | A1* | 5/2017 | Parra | G06F 11/3409 |
| 2018/0268015 | A1* | 9/2018 | Sugaberry | G06N 3/063 |

OTHER PUBLICATIONS

Aggarwal, Charu C, "Outlier Analysis Second Edition", IBM T. J. Watson Research Center Yorktown Heights, New York, (Nov. 25, 2016), 54 pgs.

Chandola, V, et al., "Anomaly Detection: A Survey", In Journal of ACM Computing Surveys, vol. 41, Issue 3, (Jul. 2009), 58 pgs.

Das, Santanu, et al., "Anomaly Detection in Flight Recorder Data: A Dynamic Data-driven Approach", For review for presentation in ACC 2013, Washington DC, (2013), 7 pgs.

Jin, Shi, et al., "Toward Predictive Fault Tolerance in a Core-Router System: Anomaly Detection Using Correlation-Based Time-Series Analysis", IEEE Transactions on Computer-Aided Design of Integrated Circuits and Systems, vol. 37, No. 10, (Oct. 2018), 14 pgs.

Konecny, Jakub, et al., "Federated Learning: Strategies for Improving Communication Efficiency", (2016), 10 pgs.

Kwon, Donghwoon, et al., "A survey of deep learning-based network anomaly detection", Cluster Comput, (Sep. 27, 2017), 13 pgs.

Petersen, R, et al., "Voltage Transient Detection and Induction for Debug and Test", Proc. IEEE Int. Test Conf, (2009), 10 pgs.

Tshagharyan, G, et al., "An Effective Functional Safety Solution for Automotive Systems-on-Chip", International Test Conference, (2017), 10 pgs.

Yilmaz, Ender, et al., "Adaptive Multidimensional Outlier Analysis for Analog and Mixed Signal Circuits", International Test Conference, (2011), 8 pgs.

"Road vehicles—Functional Safety, International Organization for Standardization", 1st version Part 1 out of 12, (2011), 42 pgs.

"Road vehicles—Functional Safety, International Organization for Standardization", 1st version Part 2 out of 12, (2011), 54 pgs.

"Road vehicles—Functional Safety, International Organization for Standardization", 1st version Part 3 out of 12, (2011), 38 pgs.

"Road vehicles—Functional Safety, International Organization for Standardization", 1st version Part 4 out of 12, (2011), 44 pgs.

"Road vehicles—Functional Safety, International Organization for Standardization", 1st version Part 5 out of 12, (2011), 100 pgs.

"Road vehicles—Functional Safety, International Organization for Standardization", 1st version Part 6 out of 12, (2011), 66 pgs.

"Road vehicles—Functional Safety, International Organization for Standardization", 1st version Part 7 out of 12, (2011), 24 pgs.

"Road vehicles—Functional Safety, International Organization for Standardization", 1st version Part 8 out of 12, (2011), 72 pgs.

"Road vehicles—Functional Safety, International Organization for Standardization", 1st version Part 9 out of 10, (2011), 38 pgs.

"Road vehicles—Functional Safety, International Organization for Standardization", 1st version Part 10 out of 12, (2011), 90 pgs.

"Road vehicles—Functional Safety, International Organization for Standardization", 1st version Part 11 out of 12, (2011), 188 pgs.

"Road vehicles—Functional Safety, International Organization for Standardization", 1st version Part 12 out of 12, (2011), 52 pgs.

* cited by examiner

TABLE 2. EXAMPLE OF DATA STRUCTURE

| i | $Y_{i1}$: VDM FUBLET #1 (IN V) | $Y_{i2}$: START TIME OF VDM #1 (IN # OF CLOCK CYCLE) | $Y_{i3}$: VDM FUBLET #2 (IN V) | $Y_{i4}$: START TIME OF VDM #2 (IN # OF CLOCK CYCLE) | $Y_{i5}$: PLL LOCK TIME (IN # OF CLOCK CYCLES) | $Y_{i6}$: LEAKAGE (IN MA) | $Y_{i7}$: IO EYE WIDTH (IN UI) | $X_{i1}$: AMBIENT TEMP (IN FC) | $X_{i2}$: TIME |
|---|---|---|---|---|---|---|---|---|---|
| 1 | {1.11,1.28,...1.09} | 1001 | {1.09,1.22,...1.04} | 1005 | 55 | 0.80 | 40 | 33 | 01/30/17 8:05AM |
| 2 | {1.09,1.25,...1.05} | 1003 | {0.98,1.18,...0.88} | 1008 | 58 | 0.88 | 38 | 17 | 01/30/17 11:55PM |
| ... | ... | ... | ... | ... | ... | ... | ... | ... | ... |
| 1000 | {1.13,1.33,...1.01} | 995 | {1.10,1.24,...1.07} | 1002 | 49 | 0.9 | 48 | 95 | 07/31/17 11:45AM |

FIG. 6

ANALOG FUNCTIONAL SAFETY WITH ANOMALY DETECTION

TECHNICAL FIELD

An embodiment of the present subject matter relates generally to improving functional safety of analog and mixed-signal circuits, and, more specifically, to anomaly detection to help predict failures for mitigating catastrophic results of circuit failures.

BACKGROUND

Safety is a critical objective for systems that may cause harm if component or system failure is unmitigated, such as in automotive systems. Functional Safety of automotive analog and mixed-signal circuits face several challenges. With more evolving safety-critical applications in automotive domain, e.g. ADAS (Advanced Driver Assistance Systems) and Autonomous Driving, it becomes key to assure functional safety of electrical and/or electronic (E/E) systems within road vehicles. Functional Safety (FuSa) is defined in International Organization for Standardization (ISO) 26262, as the absence of unreasonable risk due to hazards caused by malfunctioning behaviors of E/E systems. ISO 26262, with the first version released in 2011 and the second version due in 2018, is an international standard to regulate the safety life cycle, risk analysis, safety management, safety concept development and validation activities of automotive E/E systems. The Automotive Safety Integrity Level (ASIL: A-D) defines the safety requirements associated with a function of the system and its criticality. An ASIL target needs to be achieved by a synergic system design such that, even in conditions of failure, there is a sufficient margin of safety for the human user, e.g. driver or passenger. However, the increasing complexity of automotive E/E systems makes it challenging to reach a high ASIL level target (e.g. ASIL-D) in vehicles.

According to ISO 26262, Fault Tolerance Time Interval (FTTI) is defined as a minimum time span from occurrence of a fault in an item (i.e. vehicle) to occurrence of a hazardous event, if a safety mechanism is not activated. A safety mechanism consists of fault detection and fault reaction, thus the Fault Handing Time Interval (FHTI), i.e. a sum of the fault detection time interval and the fault reaction time interval, should be less than FTTI, in order to achieve the expected safety goal. Consequently any early detection that helps reduce the total fault handling time is much desirable from functional safety perspective. However, existing standards and systems focus on corrective action when a failure occurs.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which:

FIG. 6 illustrates a table showing an example data structure used, according to an embodiment;

DETAILED DESCRIPTION

Figure 1:
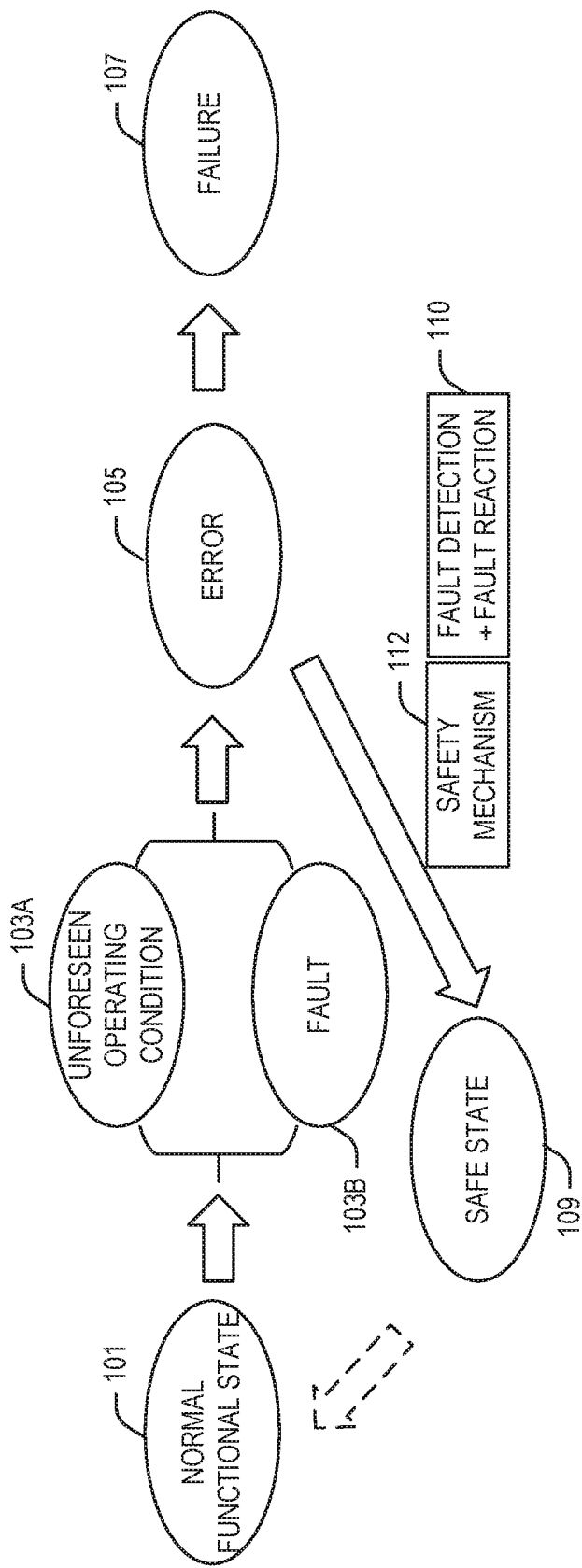
FIG. 1 is a block diagram illustrating a high-level view of state transition from a functional safety (FuSa) standpoint, according to an embodiment.

In the following description, for purposes of explanation, various details are set forth in order to provide a thorough understanding of some example embodiments. It will be apparent, however, to one skilled in the art that the present subject matter may be practiced without these specific details, or with slight alterations.

A modern vehicle may now contain thousands of semiconductor chips. Among them, a large number of analog and mixed-signal integrated circuits (ICs) play significant roles in safety critical applications. Moreover, there is a new trend in semiconductor industry to apply advanced manufacturing node (e.g., 14/10 nm) to automotive ICs. As device technology shrinks, there may be more likelihood of system failure due to analog circuit defects. Thus, it is critical to improve functional safety (FuSa) of analog circuits used in automotive systems.

Analog behavior provides an opportunity for early anomaly alert, thus improving FuSa. An embodiment of the present subject matter is a system and method relating to machine learning based methodology using data-driven anomaly detection for analog automotive circuits. Embodiments provide a framework for mining the dynamic in-field time-series data in the context of system operation to detect anomalous events from analog functional safety perspective, with minimal hardware overhead. Various embodiments may include mechanisms for improving FuSa of analog circuits in automotive applications by predicting imminent failures and taking early action to mitigate undesired results. It will be understood that while embodiments described herein use automotive circuits as an example, application of the techniques described may be used to provide improved FuSa in circuits of a variety of systems and components, and not limited to automotive circuits.

There are several challenges facing functional safety of analog circuits. First, analog circuits are more susceptible to parametric faults, defined as circuit parameter perturbation, than digital circuits. Even with a comprehensive parametric fault testing program in high volume manufacturing, there is still a possibility that some parametric faults may not be detected in manufacturing phase but deteriorate during in-field operation, resulting in a functional failure mode. Second, many analog faults may be triggered or detected only in the context of system operation in the field provoked by environmental stress, including heat, humidity or vibration, rather than in individual component level. Unknown trouble spots may exist even within original design space (e.g., 6-sigma) due to complex interaction of various elements in analog circuits. Another challenge facing analog functional safety is a lack of a widely-accepted analog fault/defect model across the industry.

Analog circuits may be characterized by continuous signal regions. This characteristic presents an opportunity to enable early analog signal anomaly detection. An analog circuit may exhibit an anomaly before it eventually leads to an actual failure in a system. Embodiments described herein use machine learning to detect such an intermediate state and take proactive action, resulting in reducing fault handling time.

Reference in the specification to "one embodiment" or "an embodiment" means that a particular feature, structure or characteristic described in connection with the embodiment is included in at least one embodiment of the present subject matter. Thus, the appearances of the phrase "in one embodiment" or "in an embodiment" appearing in various places throughout the specification are not necessarily all referring to the same embodiment, or to different or mutually exclusive embodiments. Features of various embodiments may be combined in other embodiments.

For purposes of explanation, specific configurations and details are set forth in order to provide a thorough understanding of the present subject matter. However, it will be apparent to one of ordinary skill in the art that embodiments of the subject matter described may be practiced without the specific details presented herein, or in various combinations, as described herein. Furthermore, well-known features may be omitted or simplified in order not to obscure the described embodiments. Various examples may be given throughout this description. These are merely descriptions of specific embodiments. The scope or meaning of the claims is not limited to the examples given.

In at least one embodiment, a data-driven anomaly detection method is used to account for both challenges and opportunity facing analog functional safety. An embodiment is based on a collection of in-field analog data, both runtime operational mode (e.g., in-field operation) and test mode, in a context of system operation, by using the inherent observability of functional and design-for-x (DFx) features. In this context, the x in DFx represents a type of "design-for" monitoring feature, including DFT (Design-for-Testability), DFD (Design-for-Debug), DFV (Design-for-Validation), or the like. A machine learning method, with these dynamic time-series data as training data (from the in-field analog data), is developed for anomaly detection of upcoming real-time test data. A data-driven approach is adopted without dependence on a certain fault model, so it naturally accounts for both intrinsic circuit errors and extrinsic environmental variations. Embodiments may frame an analog functional safety problem as an anomaly detection using dynamic in-field time-series data.

Functional safety of logic and memory circuits have been proposed such as using ECC (Error-Correcting Code)/LBIST (Logic Built-In-Self-Test)/infield scan. On the other hand, relatively little research has been reported on analog circuits. Analog circuit testing and DFT methods in HVM has been studied in the last 30 years. However, the wide adoption of these techniques by industry is limited compared to those for digital circuits. One obstacle in practical analog testing is lack of a widely accepted analog fault model and an efficient analog fault simulation method. This challenge is not only applicable to HVM testing of analog circuits, but also their in-field FuSa problem. Moreover, in-field defect effects in analog circuits are typically stochastically distributed rather than deterministic. This introduces more complexity to analog defect/fault modeling problem.

Anomaly detection, a.k.a. outlier detection, is the problem of finding the pattern in data that does not conform to a well-defined notion of normal behaviors. It has been used to improve test quality and reduce test cost of circuits in manufacturing flow. Various outlier detection methods have been proposed in the context of testing of analog and mixed-signal circuits, and may be integrated within manufacturing test framework. However, most methods proposed by current researchers are targeting component-level instead of system-level.

In automotive domain, one application of outlier detection in production is part average testing (PAT). PAT detects the outliers that passed original manufacturing test but have abnormal characteristics compared to other parts in the same population, and exclude them from product shipments. However, these works have been presented in the context of manufacturing testing, rather than in-field applications where a different form of data is presented, e.g., dynamic time-series data with a much longer time range.

FIG. 1 is a block diagram illustrating a high-level view of state transition from FuSa standpoint, according to an embodiment. Assume an element (defined as a system or component, e.g., hardware or software as in ISO 26262), starts with normal functional state 101. A fault or other unforeseen operating condition 103A-B, defined as abnormal condition that can cause an element to fail, will move the state to error state 105, defined as discrepancy between a computed, observed or measured value or condition, and the true, specified or theoretically correct value or condition. From a semiconductor perspective, a fault example is a stuck-at-1/0 in a logic gate or a parametric variation outsides design range, and an error can be a wrong value of a logic circuit or a degraded eye opening of an analog receiver circuit. If uncorrected or mitigated in a timely fashion, the error will cause a failure 107 of the component or system. A failure 107 is defined as termination of the ability to perform a function. A fault detection and fault reaction procedure 110 may trigger a safety mechanism 112 to move into a safe state 109, and may be recovered back to normal operation state 101, later. It should be noted that this typical FuSa state transition relies on actual faults and corrective measures rather than predictive anomaly detection prior to fault.

As mentioned above, the error may also be result of an unforeseen condition, e.g. extreme temperature out of the specification range. Another type of unforeseen condition may be due to unexpected use case shift in evolving automotive applications. For example, self-driving vehicles may end up with having much less idle time than an original forecasted model, which may lead to accelerated aging.

Dependence on environment and usage case is a key characteristic of functional safety problem different from traditional manufacturing testing.

With increased device scaling, more parametric faults contribute towards analog circuit in-field failure, besides hard defects (e.g. open/short circuits, transistor stuck-open/stuck-on) that alter circuit topological structure. With parametric faults, circuit performance may be degraded but it may still be in operation. If not detected and reacted, these parameter variations may grow and become more severe, and eventually lead to actual hardware failure.

Parametric faults may be caused by manufacturing process parameter excursion. Another source contributing to analog parametric fault in the field comes from reliability degradation issue and environmental stress. These stochastic features make the detection of analog faults from functional safety perspective more challenging. With the advanced technology node and emerging use cases (e.g. autonomous driving), existing aging and reliability models may become inapplicable for these devices over time under various environmental conditions.

Analog circuit degradation model becomes much more complicated since it needs to be done in the context of the system. Unforeseen environmental and use case variations may render predetermined pass/fail limit invalid. Cascading faults and dependent failures may only be caught in the context of the system, rather than a structural way which most digital circuit testing is using. Another challenge in analog functional safety is that, while external functional output signals of analog circuits may have customer specification, e.g., an External Design Specification, it is typically difficult to define a test specification range of many internal analog signals to observe. Embodiments described herein may overcome the aforementioned challenges to reach an expected functional safety goal of analog circuits.

Figure 2:
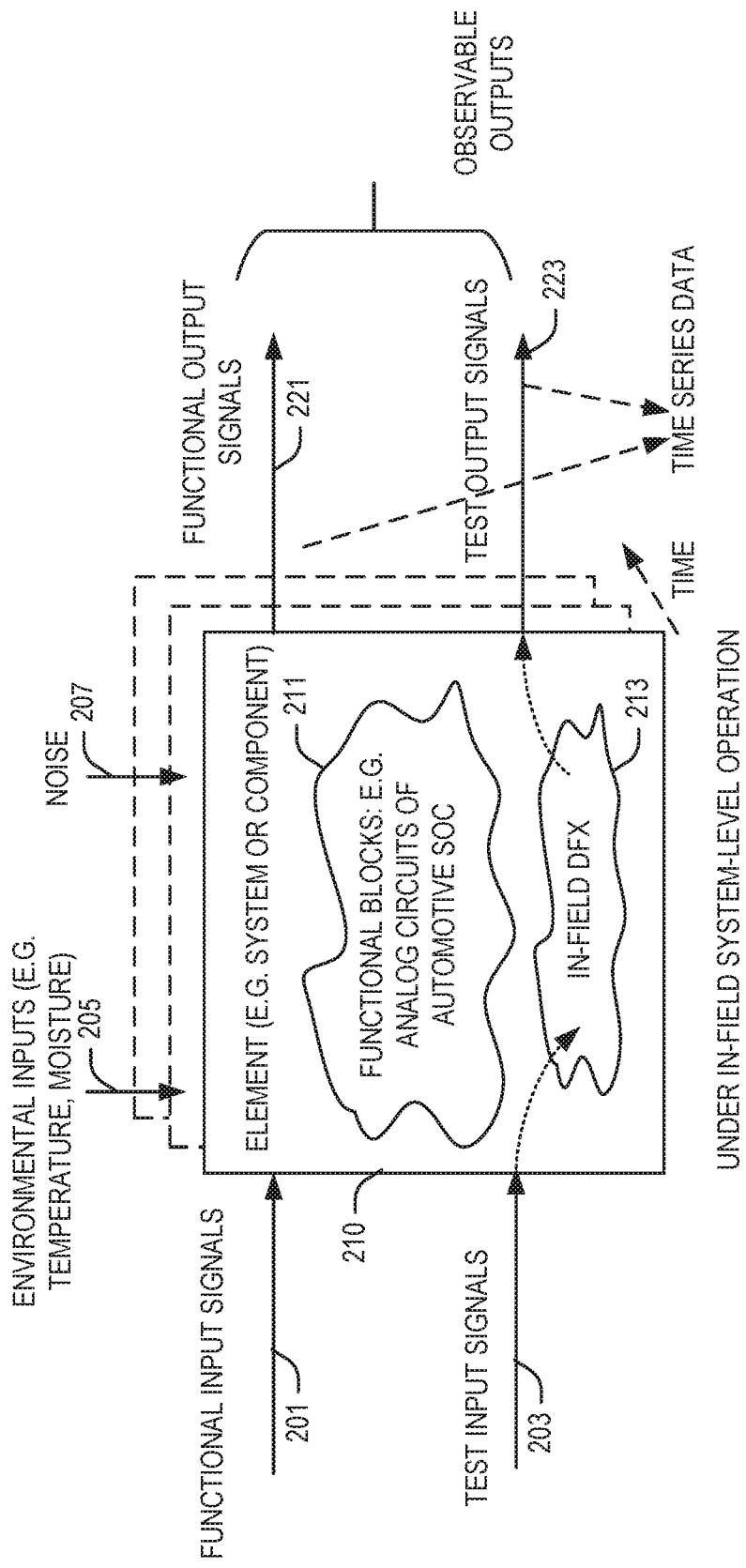
FIG. 2 is a diagram illustrating a model of the element (e.g., system or component) under analysis, according to an embodiment.

FIG. 2 is a diagram illustrating a model of the element (e.g., system or component) under analysis, according to an embodiment. The element 210 may include the analog circuit of an automotive IC 211. In an example, the element 210 receives the functional input signals 201 and sends out the functional output signals 221. There are also environmental variables 205, e.g. temperature or moisture, as inputs to the model, as well as noise 207. Some DFx features (DFT, DFD, DFV, etc.) 213 may be embedded in the element 210, which may be used to control test input signals 203 and observe the associated test output signals 223. Due to its in-field characteristics, e.g., real-time operational data, the data are expected to be in terms of time-series.

Figure 3:
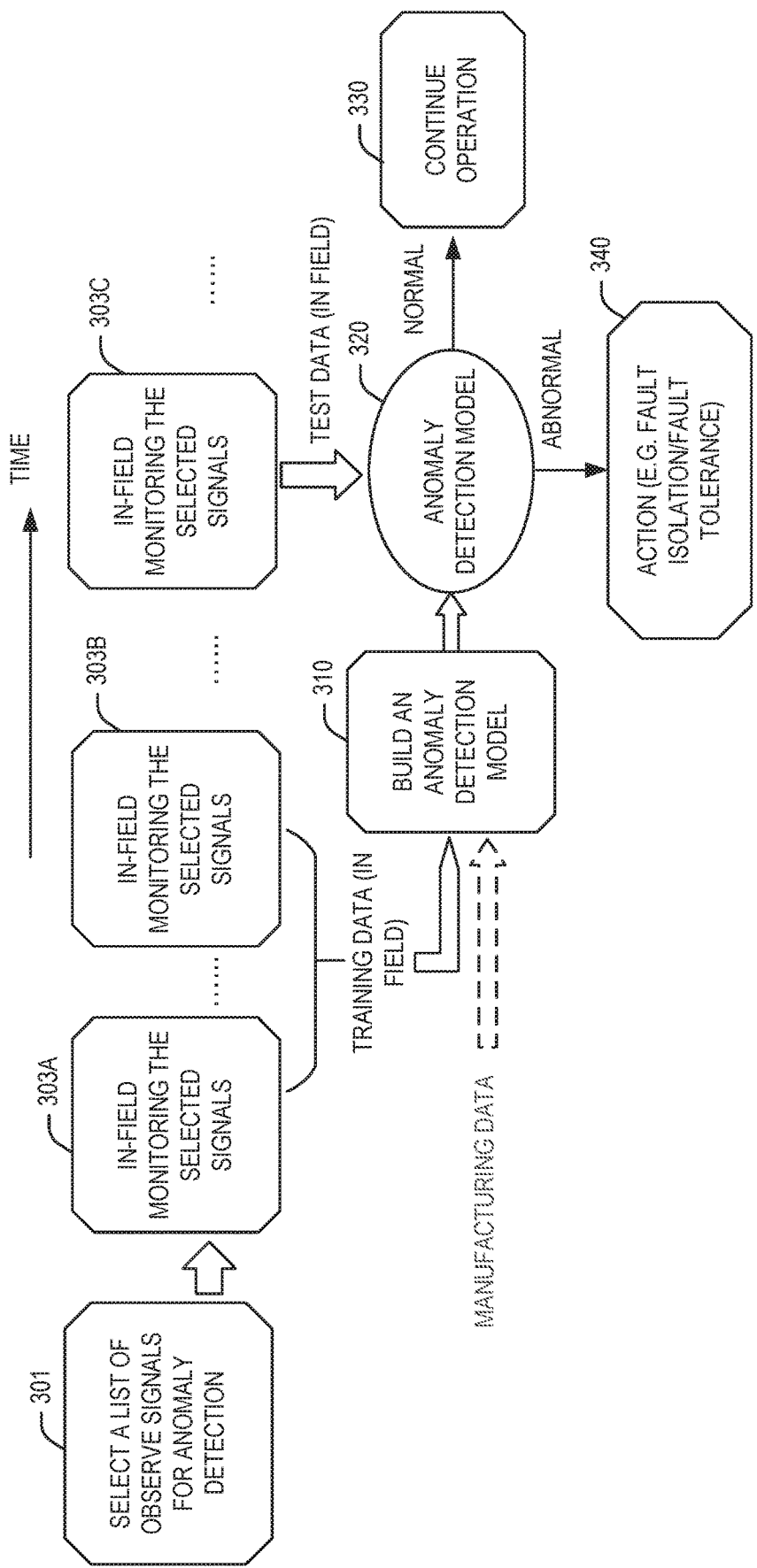
FIG. 3 is a diagram illustrating a high-level workflow of a method for applying data mining/machine learning techniques to the data collected from in-field operation of an element in order to detect an abnormal state, according to an embodiment.

FIG. 3 is a diagram illustrating a high-level workflow of a method for applying data mining/machine learning techniques to the data collected from in-field operation of an element to detect an abnormal state, according to an embodiment. An embodiment leverages the observability provided by the inherent functional and DFx features of element, thus with minimal hardware overhead, to collect in-field data. Data measurement may be triggered by a normal functional event or a test mode flag, thus not limited only within traditional key-on/key-off or periodic testing periods. Both functional data (e.g. a phase locked loop, PLL, lock time, SerDes (Serializer/Deserializer) IO data transmission retry number) and test data (e.g., leakage current) consist of a set of in-field data to collect.

A set of signals for observation is selected for anomaly detection in 301. The set may be selected based on the inherent characteristics of the element being observed, e.g., based on in-field signals capable of being monitored. The in-field monitoring of the selected signals 303A-C provide input signals for training, as well as runtime operation. This set of in-field data, along with manufacturing and electrical characterization data (and/or previous product data) when being provided, is used to train and build an anomaly detection model 310. After training, this anomaly detection model 320 may be used to test the newly monitored in-field data series 303C, and output the associated anomaly score.

An anomaly score presents the degree to which a test data instance is considered as an anomaly. An anomaly score may be further correlated to a test specification limit, if available. In an example, the anomaly score may be characterized as either normal or abnormal. A normal anomaly score may enable continued operation 330 or trigger an action 340. The anomaly score may be time-series data when performing continuous in-field anomaly detection. Both value and trend of the anomaly score may be used together to determine the level of action to an anomaly alert using domain-specific thresholds. For instance, in an example automotive system, three action levels may result from the anomaly scores:

Level-1 (Red): Take action immediately;
Level-2 (Orange): Drive cautiously/check afterwards; and
Level-3 (Green): Continue monitoring.

Figure 4:
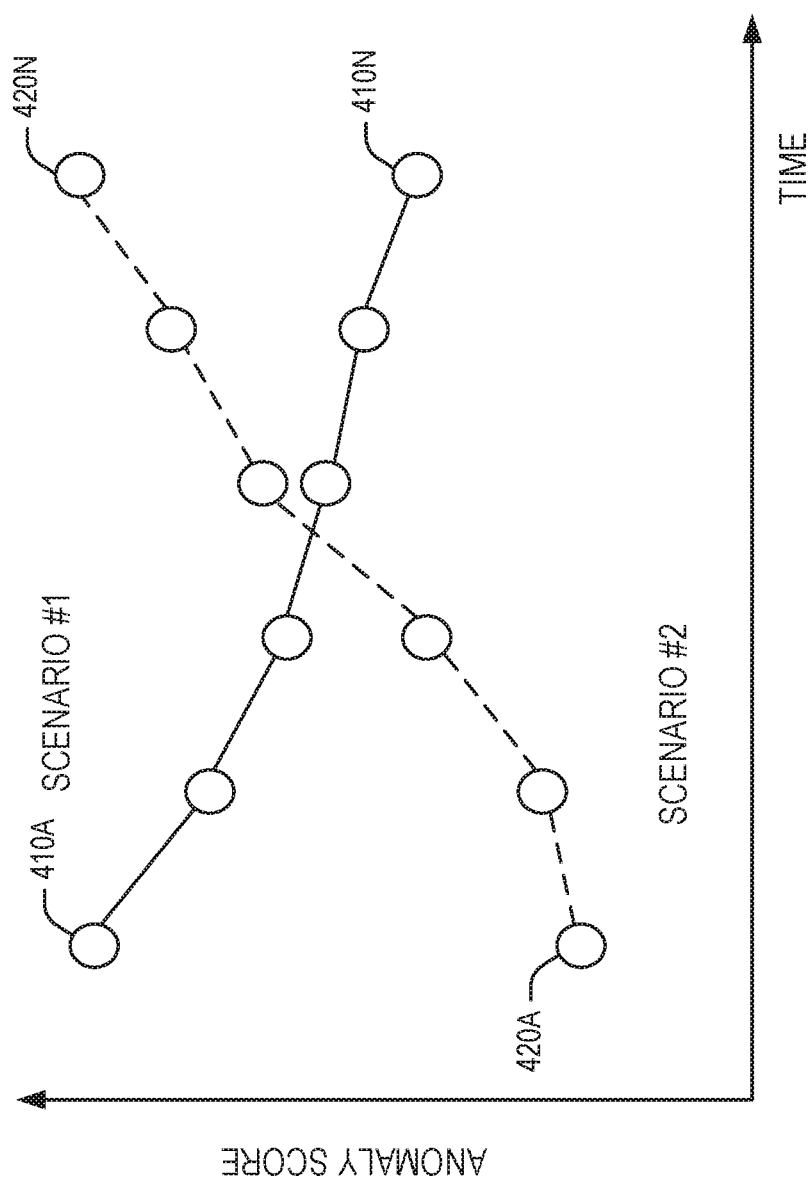
FIG. 4 illustrates example scenarios for anomaly detection, according to an embodiment.

FIG. 4 illustrates example scenarios for anomaly detection, according to an embodiment. For instance, scenario #1 410 starts with a relatively high anomaly score 410A but has a decreasing trend, to anomaly score 410N, over time. Thus a Level-3 alert (e.g., continue monitoring) may be assigned to this scenario. On the other hand, scenario #2 420 has a relatively low anomaly score 420A at the beginning, but a rapidly increasing trend to 420N, over time. Thus, a Level-2 action may be needed. The level of action to take may also depend on criticality of the associated function. For example, in a safety-critical application, a fault isolation or fault tolerance mechanism (e.g., reconfiguring or recalibrating analog circuits) may need to be taken immediately after an anomaly state is found, then followed by a further fault diagnosis.

In an embodiment, the proposed anomaly detection is not intended to completely replace any in-field testing or diagnosis step. Instead, the anomaly detection is expected to work along with in-field testing as a proactive step to provide an early alarm/notification to improve functional safety of safety-critical applications.

Figure 5:
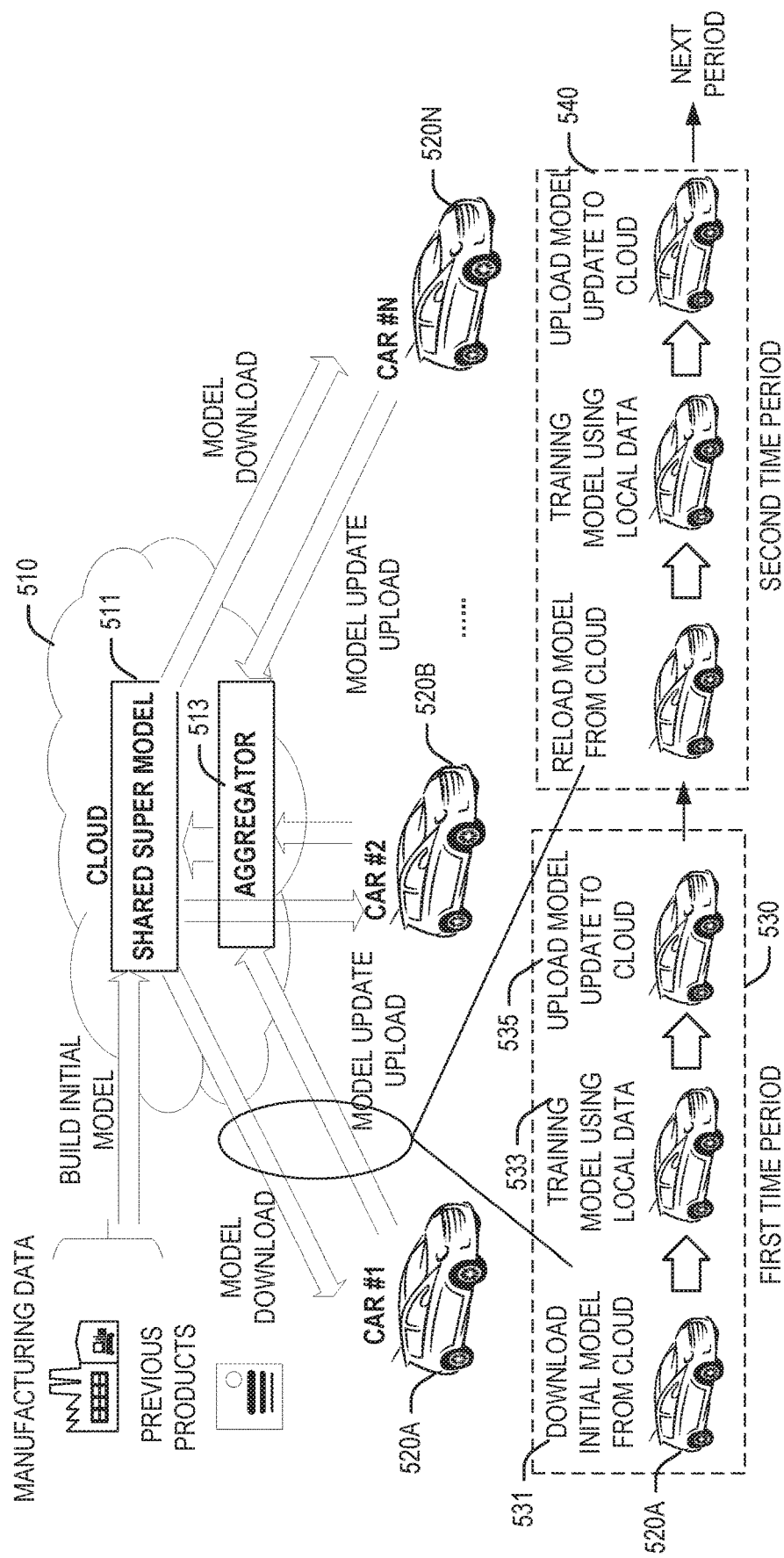
FIG. 5 illustrates a system for federated learning of analog FuSa anomaly detection, according to an embodiment.

FIG. 5 illustrates a system for federated learning of analog FuSa anomaly detection, according to an embodiment. In an embodiment, an example work flow may be further extended to fit into a framework of Federated Learning. Federated Learning is a recently-proposed machine learning approach to enable devices, widely distributed (usually with a large number), to collaboratively learn a shared prediction model while keeping all the training data on device. The analog FuSa anomaly detection workflow under a Federated Learning framework may include a cloud or cloud server 510 having a shared "super model" 511 of anomaly detection for automotive analog circuits to analyze. The shared super model may be initially built based upon manufacturing and vehicle test data or previous similar products. Each individual car 520A-N first downloads the current model from the cloud 510, then updates the model by learning data collected by the car.

In an example, in a first time period 530, car 520A downloads the initial model at 531. Local data is collected with the in-field functional or DFx collection modes and used to train the model locally at 533. Updates to the model may then be uploaded back to the cloud 510, at 535. Local learning results may be summarized as a small model update. In an embodiment, only the model update, rather than the entire set of local learning data, is uploaded back to the cloud with encrypted communication to protect security and privacy. The cloud may include an aggregator 513 to combine updates from a large number of cars 520A-N to improve the shared model. This process may be performed dynamically, e.g., each individual car reloads the updated model from the cloud periodically and starts the same work flow again, as seen in the second time period 540.

Data structures using both functional monitors and DFx features may be used to provide data to train and operate a machine learning model for anomaly detection. Advances of analog DFx provide a great opportunity for collecting a large amount of in-field data. In general, two types of testing may be performed by analog DFx, e.g., AC testing and DC testing, as shown in Table 1. Measurement data of AC testing are dynamic signals, while DC testing are static signals. Table 1 shows an example of analog DFx in a commercial automotive system on a chip (SOC).

TABLE 1

Example of Analog DFx

| CATEGORY | DFx MODE | AC/DC |
|---|---|---|
| IO DFT | Leakage Test | DC |
| IO DFT | VIX/VOX | DC |
| IO DFT | IO Loopback | AC |
| POWER DFD | Voltage Droop Monitor | AC |
| POWER DFD | On-Die Droop Inducer | AC |
| POWER DFV | Power State Monitor | DC |
| ANALOG DFD | Analog Monitor Bus | DC |
| THERMAL DFV | Junction Thermal Sensor | DC |

A list of functional and DFx monitoring features in the element is selected and enabled during in-field operation. Data collected from the in-field monitoring may be dynamic time-series data. An anomaly detection data structure may be used to represent the data. A feature is defined as a signal or variable to monitor used for anomaly detection and a feature list may be present in the data structure defined as:
$\{Y_{ij}: i=1:N, j=1:M\}$, where i represents the index in the time-series, j represents the feature number.

A covariate is defined as baseline characteristic of an element. Examples of covariates include baseline ambient temperature, humidity of environment, as well as, date of each measurement. This data leverages the concept of "baseline covariate" in statistics research. Covariate adjustment may be performed when preprocessing data for anomaly detection model. A covariate list may be present in the data structure defined as:
$\{X_{ij}: i=1:N, j=1:K\}$, where i represents the index in the time-series, j represents the covariate number.

FIG. 6 illustrates Table 2 showing an example data structure used, according to an embodiment. In this example, the columns 601-609 represent elements of the feature lists $Y_{ij}$ and covariates $X_{ij}$. The rows represent the index i 600 and the columns represent the feature or covariate. For instance, the feature element $Y_{12}$, Start time of VDM #1 is shown in column 602. Each row may be associated with a specific time in the time-series as indicated in column 609. For instance, at the time on January 30, 2017, 11:55 PM, feature $Y_{16}$ the leakage (in MA), is measured as 0.88 (at 626). Thus, the time-series data for the feature and covariates may be represented in an array data structure, as illustrated. It will be understood that other structures may be used, such as linked lists, or similar.

Figure 7:
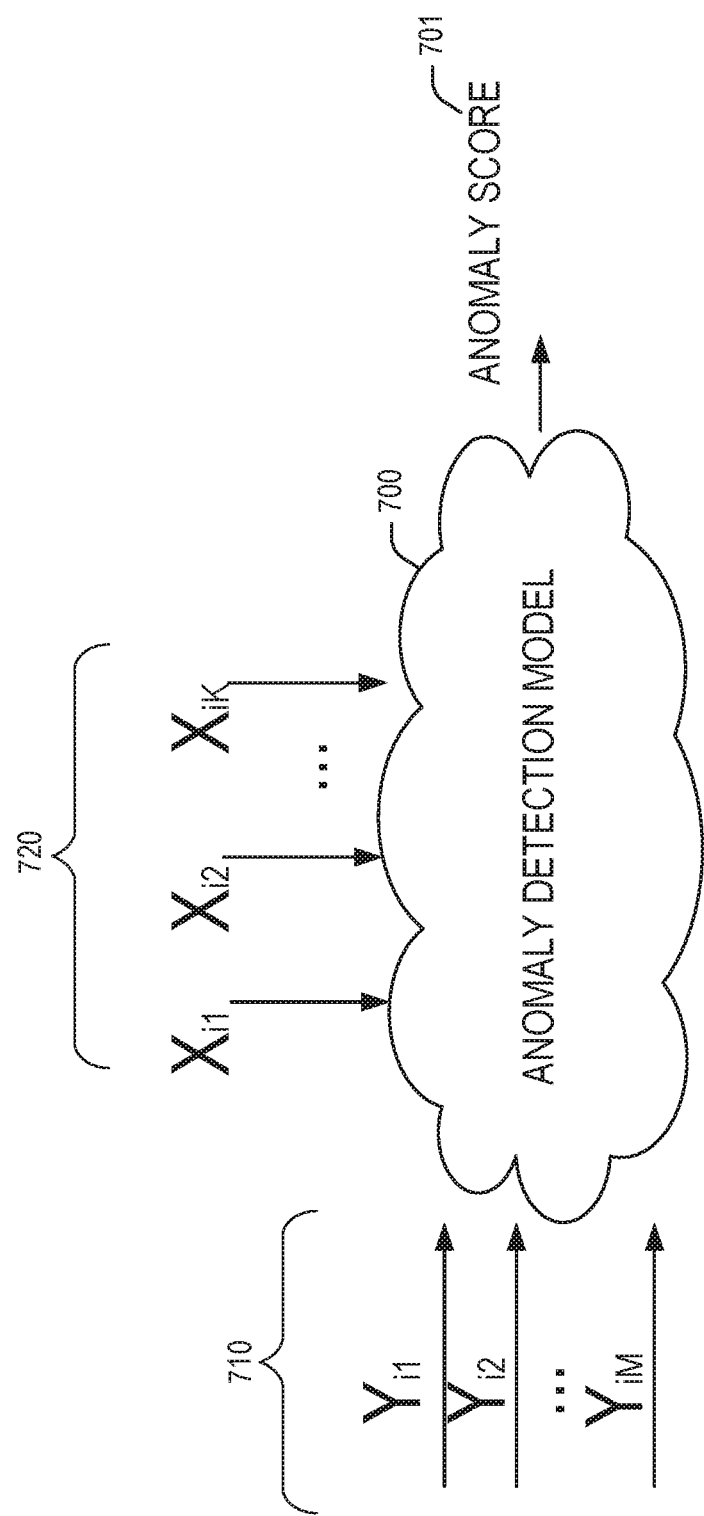
FIG. 7 illustrates anomaly detection using the data structure as illustrated in FIG. 6, according to an embodiment.

FIG. 7 illustrates anomaly detection using the data structure as illustrated in FIG. 6, according to an embodiment. In an example, time-series feature data Yij 710 and covariate information Xij 720 may be input to an anomaly detection model 700 to provide an anomaly score 701.

Figure 8:
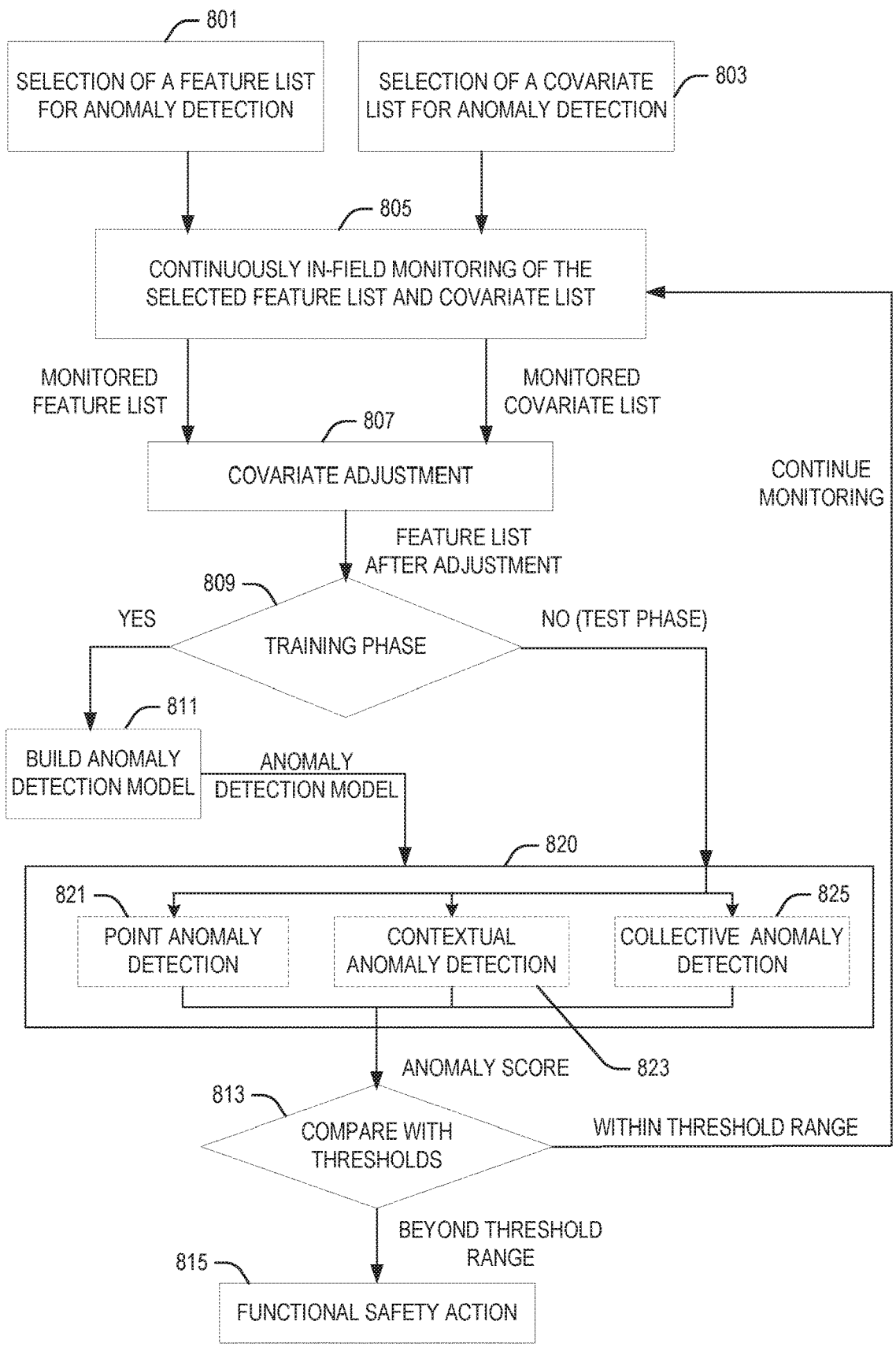
FIG. 8 is a flow chart illustrating a method for detecting anomalies for functional safety, according to an embodiment.

FIG. 8 is a flow chart illustrating a method for detecting anomalies for functional safety, according to an embodiment. In an embodiment, a feature list for anomaly detection is selected in block 801. The feature list may depend on the availability of in-field sensors on the system or components of the system. A covariate list is selected for detecting anomalies in block 803.

The in-field sensors continuously monitor the selected feature list and covariate list in block 805. The monitored feature and covariate data is provided to logic that performs covariate adjustment in block 807. A determination is made as to whether the data is part of a training phase for a machine learning model, in block 809. During a training phase an anomaly detection model is built in block 811. The data may be automatically correlated by a variety of machine learning algorithms or processes. In an embodiment, the received data may be manually labeled by one or more experts to classify anomalies and normal data. After the initial or updated anomaly detection model 820 has been trained, the model may be used to detect anomalies from real time in-field data.

In an embodiment, the anomaly detection model may include multiple models or processes to detect a variety of anomalies in the collected feature data. In an embodiment, the anomaly detection model may include one or more of point anomaly detection logic 821, contextual anomaly detection logic 823, and collective anomaly detection logic 825. The anomaly detection model 820 may correlate the various forms of anomalies 821, 823, 825 and provide an anomaly score. The anomaly score may provide a likelihood or probability that the collected data indicates an anomaly for an individual feature.

The anomaly score is compared to pre-defined thresholds in block 813 to determine whether the score indicates an anomaly or is within a threshold range. If the in-field data is within the threshold range, the process continues with the monitoring in block 805.

When the anomaly score is outside of the threshold range, a functional safety action may be triggered in block 815. As discussed above, there may be different action levels associated with different thresholds. In an example, the anomaly score may indicate a red level which may require an immediate action. In another example the score may indicate an orange level which may notify a driver/operator that failure of a specific type is imminent and to check levels after a pre-determined additional operating time. In another example, the operator may be warned to perform some maintenance action soon, such as when oil viscosity indicates an oil change is due, without regard to the number of miles or days since the last change.

In an embodiment, the various anomaly detection logic 821, 823, and 825 use time-series data that show trends and changes in measurements. Time-series data may be classified into the following categories, based on their characteristics: stationary process; monotonic process; recurrent process; and other processes, as discussed below.

Stationary process: A weak-sense stationary or wide sense stationary (WSS) process is defined as a type of time-series process that its mean and correlation function do not change by shifts in time. In practice, if a signal remains relatively stable across the temporal domain, it can be classified in this category. One example is an on-die voltage regulator DC output after temperature covariate adjustment in a relatively short time range (e.g. within a year).

Monotonic process: Time-series data in this category has a monotonically increasing or decreasing trend across the temporal domain. One example is an on-die leakage current value (after temperature covariate adjustment) in a relatively long time range (e.g. across years), which would be slowly increased due to circuit degradation.

Recurrent process: Data in this category has a recurrent trend across the temporal domain. One example is the measured data from on-die voltage droop monitor (VDM), which includes a series of recurrent events and in each event signals have a range of dynamic frequency. Another simpler example is the monitored clock signal from PLL, expected to have a relatively stable frequency after PLL is locked.

Other processes: Other processes may include any time-series data that cannot be categorized into the aforementioned categories.

One fundamental difference between time-series and a random sampling (e.g., a Monte-Carlo simulation) is that time-series often has memory, quantified as autocorrelation. In other words, data in one time point influences the data in subsequent time points. Another characteristic of time-series is that it is synchronous nature. It indicates a certain relationship between multiple time-series data in temporal domain. This is important for a certain type of anomaly detection where such an underlying characteristics exists.

For functional safety problems, different time scales, e.g., a multi-resolution approach, may be needed. Data at a large time scale may be aggregated using the data at a smaller time scale. For example, two resolutions of data may be created, in practice, e.g., per day, and per each clock cycle as a time unit, respectively.

Figure 9A:
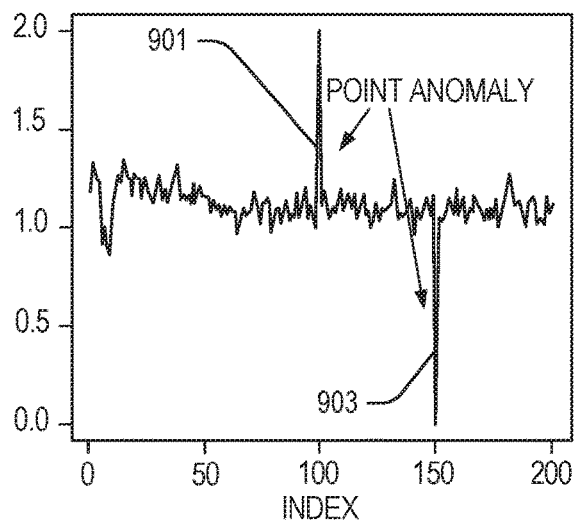
FIG. 9A illustrates a times series set of single point data, according to an embodiment.

As mentioned above, different types of anomalies may be encountered in an analog functional safety problem: point anomaly, contextual anomaly and collective anomaly. In an example point anomaly detection 821 may use individual data points. An individual data point may be considered as anomalous with the rest of the data set, e.g., the monitored voltage in a time point has a much higher or lower value compared to all other data. FIG. 9A illustrates a times series set of single point data, according to an embodiment. Single point anomalies may be seen at 901 and 903, where point 901 shows an upward spike in the data and 903 shows a downward spike in the data.

Figure 9C:
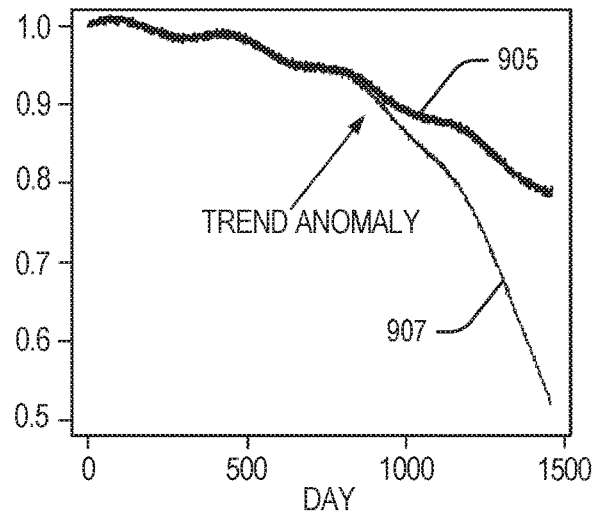
FIG. 9C illustrates trend anomaly in a data set, according to an embodiment.
Figure 9B:
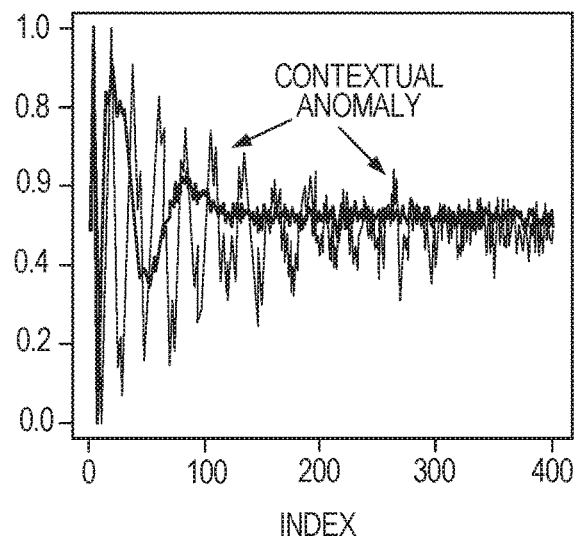
FIG. 9B illustrates contextual anomaly in a data set, according to an embodiment.

FIG. 9B illustrates contextual anomaly in a data set, according to an embodiment. A contextual anomaly means a data instance being anomalous in a specific context, but not otherwise. It is also known as conditional anomaly. In FIG. 9B, an unexpected high frequency supply voltage toggling, when it is expected to be settled down after a di/dt event, may be considered as a contextual anomaly. One special type of contextual anomaly is a trend anomaly. This is defined as a violation of an overall trend of data across the temporal domain within a context. For example, a much faster decaying rate happens in a certain time point of a signal to observe, as shown in FIG. 9C. Here the line 905 is the expected downward trend and the sharper decline 907 may be anomalous as compared to the expected trend. The expected trend may be determined using non-anomalous data to train the model, for this feature.

Figure 9D:
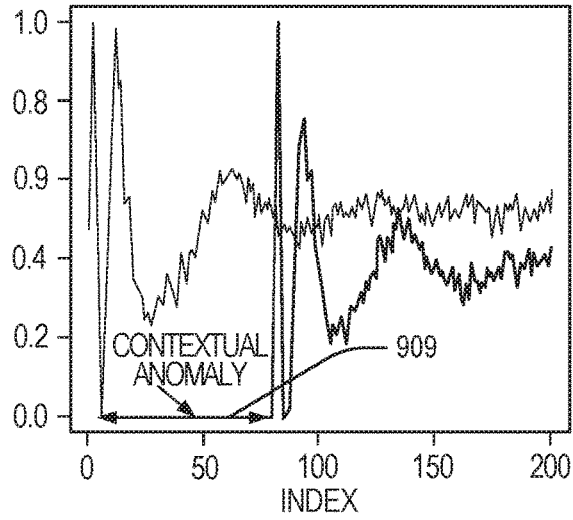
FIG. 9D illustrates a collective anomaly in a data set, according to an embodiment.

FIG. 9D illustrates a collective anomaly in a data set, according to an embodiment. A collective anomaly is defined as a collection of data instances anomalous with respect to the entire data set. Each individual data instance in a collective anomaly may not be an anomaly itself. For example, as shown in FIG. 9D, two time-series of voltage droop signals need to meet a certain lag time requirement between them. If there is an abnormally larger lag between them 909, it may be considered a collective anomaly, while each individual time-series data may still be normal itself. It should be noted that an anomaly may represent different types of anomalies at a different time scale. For example, a collective anomaly in a small time scale might be aggregated as a point anomaly in a larger scale.

Referring again to FIG. 8, the covariate adjustment logic 807 may include pre-processing logic to transform the raw in-field data collected from observability circuits (at block 805) to a representation suitable for an anomaly detection method. It may be needed for time-series analysis to perform data pre-processing e.g., changing attributes of a time-series or deconstructing the time-series data into its component parts, e.g., seasonal trend decomposition (STD). Smoothing may be used to remove noises in time-series data, but care should be taken not to smooth out anomalous data, e.g., setting the appropriate smooth thresholds/ranges for the data set.

Different types of methods have been proposed to detect an anomaly in time-series data. In an embodiment, proximity-based method and the predictive model based method are used to analyze the data. It should be noted that embodiments described herein may use a variety of anomaly detection methods to improve analog FuSa and not limited to any certain type of algorithm or method. This framework is expected to work with any statistical or machine learning method suitable for various types of data.

The basic idea of proximity-based method is to model an anomaly as a data instance that is isolated (or sparsely populated) from the remaining data based on a proximity function. The common ways of defining proximity include cluster-based (e.g. clustering techniques), distance-based (e.g., K-Nearest-Neighbor KNN method), or density-based (e.g. Local-Outlier-Factor LOF method).

In predicative mode based methods, a predictive model is learned from historical data such as training data, with different machine learning/statistical learning approaches. Depending on availability of training data type, the methods can be classified into generative or discriminative approaches. A generative approach is solely based on normal training data to build a model, and then evaluate each test case to determine how well it fits the model. On the other hand, a discriminative approach is to learn the difference between normal and anomalous data; thus both cases will be needed in training. In the example of an automotive application, it is highly expected that a very rare occurrence of anomaly event during the training phase due to high reliability of automotive electronics. It may be challenging to collect the labeled anomaly data fully representing its underlying statistical distribution. It will be more natural to assume the training data that contain solely normal cases. Thus, a generative approach may be taken in this application.

After learning, the predictive model may be applied to test data, where the discrepancy between the predicted value and the actual observation data will be computed and used to calculate the anomaly score. The traditional time-series statistics learning methods include Moving Average (MA), Autoregressive model (AR), and Autoregressive integrated moving average (ARIMA). While this group of methods performs well on stationary or monotonic processes, they usually have challenges of handling with much more complicated recurrent process data. With recent advance of deep learning, a special type of deep-learning model, i.e. Recurrent Neural Network (RNN) shows a great opportunity of applying to time-series data anomaly detection, especially for complicated recurrent data collected in analog circuits. Unlike the traditional feedforward neural network, RNN includes the hidden layer nodes that maintain an internal state (memory), which makes it suitable to use time-series data with autocorrelation characteristics. Different types of RNN, including LSTM (Long Short-Term Memory) may be used.

For a generative anomaly detection method, it may be assumed that the training data solely contains normal data, e.g., non-anomalous data. However, in an actual scenario, the training data may contain some anomalous data that is being treated as normal under the aforementioned assumption. This is a type of training data contamination. In an embodiment, the applied anomaly detection method may be robust to deal with this sort of training data contamination.

Evaluation of the anomaly detection method using a method known as Area under the ROC Curve, or ROC-AUC may be used. In a Receiver Operating Characteristic Curve (ROC), the True Positive Rate is graphed against the False Positive Rate. It may be shown that given a scoring of a set of points in order of their propensity to be anomaly (e.g., higher scores indicating greater degree of being anomalous), the ROC AUC is equal to the probability that a random selected normal-anomalous data pair is scored in the correct order.

To illustrate results of embodiments described herein, a simulated example based on a realistic circuit design is described. A relatively simple example has been chosen for sake of simplicity and for illustration. However, it should be noted that embodiments are not limited to this example and may be extended and applied to more complicated cases of actual application scenarios.

In an example, an Intel Architecture (IA) core-based automotive SOC has five Voltage Droop Monitors (VDM) placed across the die spatial area. The monitors may be triggered by a functional event in the power domain or a test mode event to measure real-time power supply voltage droop over single or multiple clock cycles. Each detector, or monitor, may be individually calibrated to account for process, voltage and temperature (PVT) variation before measurement. One operation mode of VDM is to capture the droop on consecutive cycles to reconstruct the voltage transient waveform.

In an embodiment. VDMs are enabled in-field in context of system operation to collect the monitored data each time when a predefined event (e.g. power gate transition) is triggered. For the sake of simplicity it is assumed a same clock cycle number is used in each VDM measurement, e.g., 100. In actual measurement, however, the time window may be configured differently. Applying the data structure described above, the feature list and a covariate list for the five VDM data sets may be created as follows:

Feature list:
Yi1: VDM #1 measured data of voltage droop
Yi2: VDM #1 clock cycle of each measurement start
. . .
Yi9: VDM #5 measured data of voltage droop
Yi10: VDM #5 clock cycle of each measurement start.
Covariate list:
Xi1: Ambient temperature
Xi2: Time stamp.

In an example, VDM #1, #2, #3 monitor the same power plane in different locations, while VDM #4, #5 monitor another power plane. With this domain knowledge provided by circuit design, the original feature list may be characterized into two feature groups: Feature Group #1: ($Y_{i1}$, $Y_{i2}$, $Y_{i3}$, $Y_{i4}$, $Y_{i5}$, $Y_{i6}$), Feature Group #2: {$Y_{i7}$, $Y_{i8}$, $Y_{i9}$, $Y_{i10}$}. Features are correlated within the same feature group and are independent between groups. From anomaly detection perspective, point anomaly and contextual anomaly are analyzed for each individual feature, while collective anomaly need to be checked for features within the same feature group.

In this example, 250 days of in-field operation with an average of four measurements per day are collected for the training data for anomaly detection. This data generates a set of time-series data containing 1,000 measurements. If there are 100 clock cycles per each VDM measurement, for features {$Y_{i1}$, $Y_{i3}$, $Y_{i5}$, $Y_{i7}$, $Y_{i9}$}, there will be 100,000 time indexes across temporal domain time as training data. Using a larger time scale of one time index per each measurement, representation is suitable to detect long-term trend anomalies. An example of data representation with different time scale is shown in FIG. 10.

Figure 10:
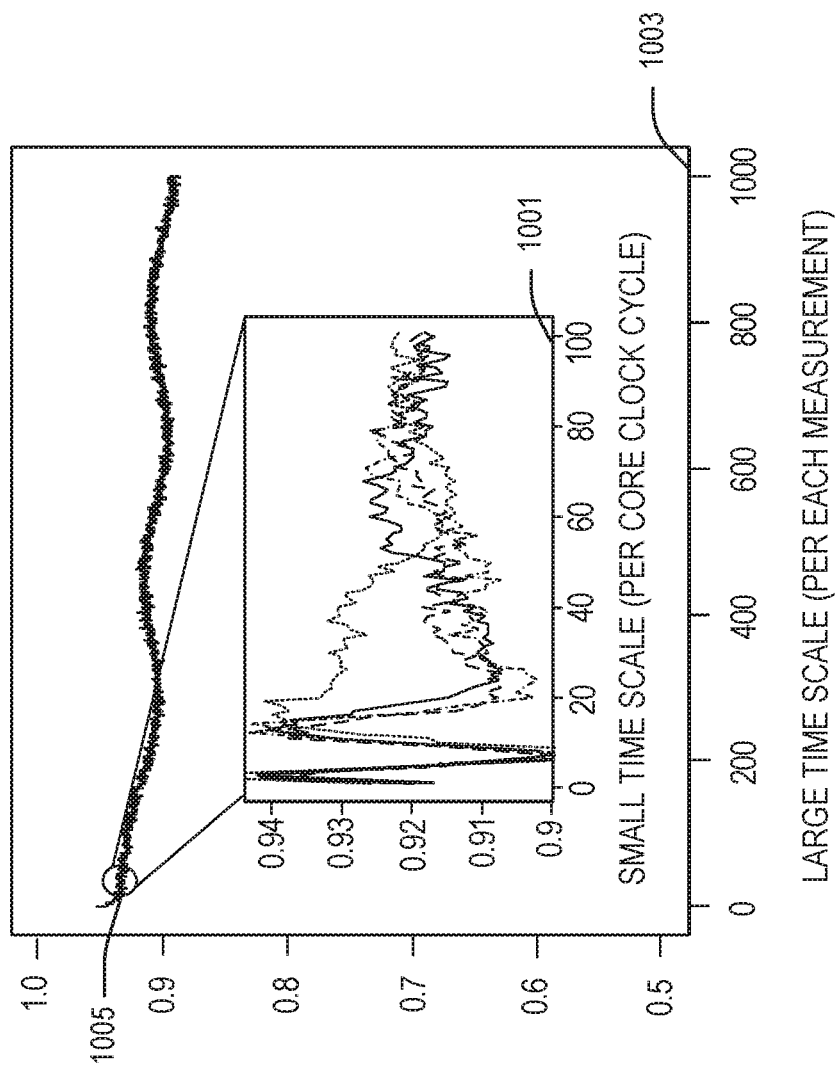
FIG. 10 illustrates an example of data representation with different time scale, according to an embodiment.

FIG. 10 illustrates two time scales 1001 and 1003 for the same data set. In this example, the data 1005 collected at time scale 1001 may be viewed at time scale 1003. It will be understood that analyzing the data at different time scales may reveal different kinds of anomalous data, as described above.

Since an automotive IC is designed to operate at a high reliability, the actual occurrence of anomaly is expected to be rare during the operation of the system. Thus, it may be assumed that the training data shows only normal operation. Embodiments herein are analyzed to show the robustness of the anomaly detection model even when the training data is contaminated, e.g., a few anomaly cases were included in the training data but mislabeled as normal. In order to validate the effectiveness of the proposed method, a set of test data with 100 measurements was generated. Different types of anomalies were randomly inserted to 50 of the measurements, for a total of 50 anomaly cases and 50 normal cases in the test data set. Anomalies to insert included the different example modes, such as listed in Table 3, below.

TABLE 3

Anomaly mode in an example

| Anomaly Mode | Physical Mechanism | Anomaly Type |
|---|---|---|
| 1 | Soft Error or other transient defect | Point Anomaly/ Contextual Anomaly |
| 2 | Parametric variation of parasitic capacitance (C) and/or inductance (L) causing anomalous voltage transient behaviors e.g. a longer settling time | Contextual Anomaly |
| 3 | Higher amplitude caused by parametric faults Contextual Anomaly | Contextual Anomaly |
| 4 | Anomalous IR Drop | Trend Anomaly |
| 5 | Parametric variation of interconnect resistance (R) and capacitance (C) causing a larger delay between two VDM trigger events | Collective Anomaly |

Figure 11:
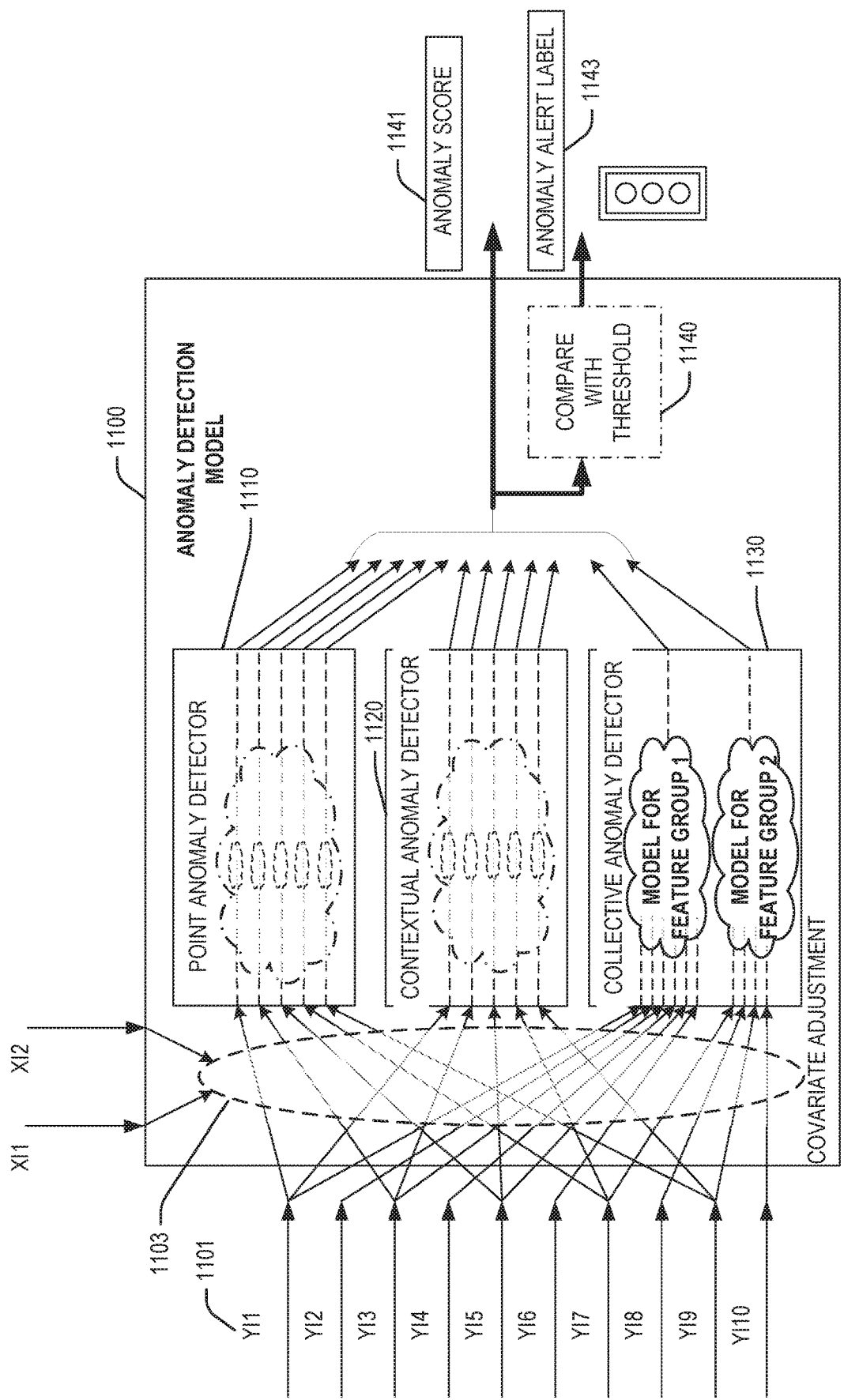
FIG. 11 illustrates a hybrid anomaly detection model to perform anomaly detection, according to an embodiment.

FIG. 11 illustrates a hybrid anomaly detection model 1100 to perform anomaly detection, according to an embodiment. After covariate adjustment 1103 of the feature list 1101, with $X_{i1}$ and $X_{i2}$, accounting for different types of anomaly, the analog FuSa problem is considered for point anomaly 1110, contextual anomaly 1120 and collective anomaly 1130. Embodiments for anomaly detection for analysis of each anomaly type, e.g., 1110, 1120, 1120, are discussed below. Once the anomaly detection 1110, 1120, 1130 is performed and aggregated, the results are compared with pre-determined thresholds 1140. When the comparison shows an anomaly, the anomaly score 1141 may be provided to a fault mitigation component (not shown) and/or labeled with an alert 1143.

A point anomaly detector 1110 may be built using a data statistical distribution model at each time point using the training data for each feature. A statistical metric (e.g., 3-sigma) may be used to set a threshold. For each upcoming test data, a point anomaly is detected if the measured value is beyond the threshold.

Point anomaly is analyzed here for the anomalous data point with respect to the distribution of all training data of the same feature. There is another type of anomalous data point, which may still be within the threshold range from all training data, but can be anomalous within the context of this series of data. A special case of contextual anomaly is described below.

Due to the complexity of data in the category of contextual anomaly, both the proximity-based and predictive models are evaluated. First to be considered in this example is a type of contextual anomaly caused by Anomaly Mode #2 (as seen in Table 3), e.g., signals have an abnormally longer setting time after a di/dt event. A proximity-based method is first evaluated by using the distance between the test data and training data as anomaly score. The sum of difference of values between a test data and each historical data across the temporal domain is evaluated. In order to improve robustness against inherence noises, the anomaly score may be chosen as the median value of distances between test data and all training data.

In an embodiment, a predictive-model based method using a RNN model may be used. There are different ways to apply RNN to time-series data anomaly detection. The approach chosen in this example, is based on an autoencoder method. An autoencoder is used to train RNN hidden layers to capture the nonlinear signature of time-series data. With a concept similar to compression and de-compression, RNN reads the time-series data as input and predicts the same sequence gain. The difference between the actual data and predicted data may be used as anomaly score. This method is based on the assumption that the data that has the similar statistical characteristics with the training data works well with the trained RNN-based autoencoder. On the other hand, an anomaly signal that has quite different statistical characteristics would have a larger estimation error, leading to a larger anomaly score.

The performance is evaluated for both instance-based method and RNN-based method using ROC-AUC. The high values of ROC AUC from both methods show a good possibility of distinguishing anomaly from normal data case.

Note that the above methods are also applicable to detect the individual anomalous data point. Instead of creating an aggregated anomaly score using the value of all time points, individual anomaly scores for each time point may be used. If any of the values is larger than the predefined value, then such a "point" anomaly in the context is detected.

Further analysis of a potential correlation between the anomaly score and a test specification limit (when available) may be performed. Anomaly Mode #3 (as in Table 3), e.g., gradually increasing the voltage amplitude, a list of anomaly scores from aforementioned distance-based method may be plotted along with the associated amplitude increase percentage. For example, the anomaly score may be increasing with amplitude increase. Assume there is a test specification limit of 48% percentage amplitude increase from nominal, beyond which a test would fail. It is correlated to an anomaly score of 0.35 (Level I). By using the proposed anomaly detection method and applying the domain knowledge, different levels of anomaly alert may be reported, with Level I correlated to test specification failure. This demonstrates that early detection before test specification violation may be provided.

Trend anomaly is a special type of contextual anomaly. The trend anomaly in a small time scale may be detected by the similar distance-based and RNN-based method described above. For the trend anomaly in a large time scale (e.g., Anomaly Mode #4, as in Table 3), the Federated Learning may be used to learn a long-range trend from a large number of vehicles.

In the example, collective anomaly detection 1130 (FIG. 11) may use features $\{Y_{i2}, Y_{i4}, Y_{i6}\}$ in Feature Group #1, and $\{Y_{i8}, Y_{i10},\}$ in Feature Group #2 to detect a type of collective anomaly (Anomaly Mode #5, as in Table 3), e.g., abnormal delay between VDM measurement start times, for predefined event trigger times. After transforming these features, e.g., creating a new feature $Y_{i(2,4)}=(Y_{i2}-Y_{i4})$, the same method may be used as point anomaly detection to estimate the statistical distribution of new features, and report the outlier when crossing a defined threshold.

Considering a much more complicated correlation between two features, the above statistical method may not be sufficient. For example, there is an underlying relationship between two VDM transient waveforms, e.g., both should respond to a same di/dt event. In this example, the aforementioned prediction model based method (e.g., RNN model) may be extended to learn a complicated nonlinear correlation between two features. Any test data that violates the learned correlation would be deemed as a collective anomaly.

As discussed above, robustness of anomaly detection methods described herein may be analyzed against violation of the assumption that training data set contains solely normal data. This is important in practical application of the described embodiments where data collected in the training phase may include some anomalous events. Robustness may be evaluated using both distance-based and RNN-based methods by randomly injecting anomalies into the training data with different percentage, and calculate ROC-AUC respectively. In this example both methods have a good robustness against the training data contamination, especially when anomaly data is less than 10% of the whole training data set. It is expected to be a valid scenario for practical application from automotive analog functional safety perspective using anomaly detection models as described herein. Thus, implementing the methods described herein may allow early detection of anomalies prior to circuit failures to enhance functional safety in the system.

Figure 12:
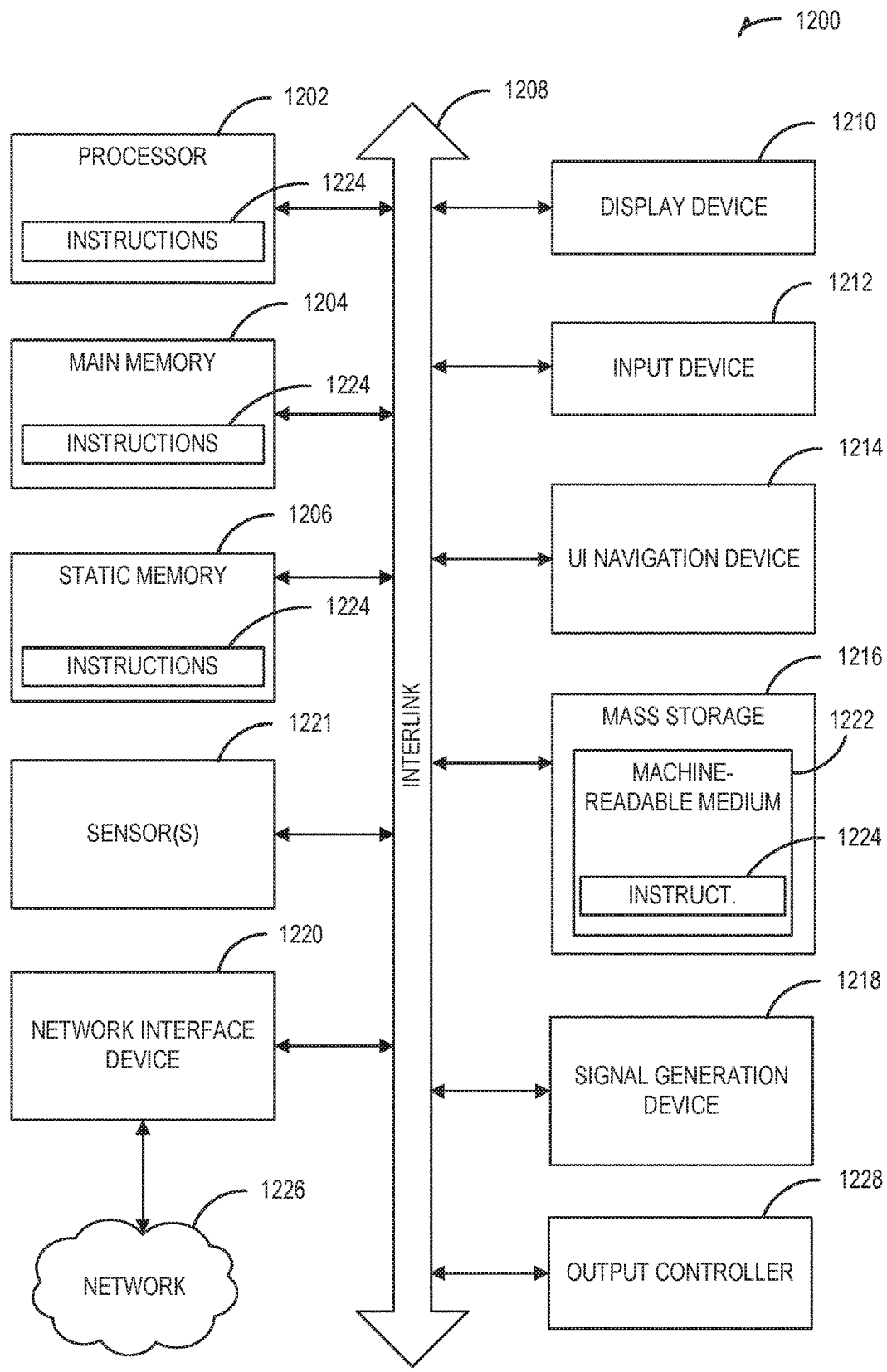
FIG. 12 is a block diagram illustrating an example of a machine upon which one or more embodiments may be implemented.

FIG. 12 illustrates a block diagram of an example machine 1200 upon which any one or more of the techniques (e.g., methodologies) discussed herein may perform. In alternative embodiments, the machine 1200 may operate as a standalone device or may be connected (e.g., networked) to other machines. In a networked deployment, the machine 1200 may operate in the capacity of a server machine, a client machine, or both in server-client network environments. In an example, the machine 1200 may act as a peer machine in peer-to-peer (P2P) (or other distributed) network environment. The machine 1200 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

Machine (e.g., computer system) 1200 may include a hardware processor 1202 (e.g., a central processing unit (CPU), a graphics processing unit (GPU), a hardware processor core, or any combination thereof), a main memory 1204 and a static memory 1206, some or all of which may communicate with each other via an interlink (e.g., bus) 1208. The machine 1200 may further include a display unit 1210, an alphanumeric input device 1212 (e.g., a keyboard), and a user interface (UI) navigation device 1214 (e.g., a mouse). In an example, the display unit 1210, input device 1212 and UI navigation device 1214 may be a touch screen display. The machine 1200 may additionally include a storage device (e.g., drive unit) 1216, a signal generation device 1218 (e.g., a speaker), a network interface device 1220, and one or more sensors 1221, such as a global positioning system (GPS) sensor, compass, accelerometer, or other sensor. The machine 1200 may include an output controller 1228, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1216 may include a machine readable medium 1222 on which is stored one or more sets of data structures or instructions 1224 (e.g., software) embodying or utilized by any one or more of the techniques or functions described herein. The instructions 1224 may also reside, completely or at least partially, within the main memory 1204, within static memory 1206, or within the hardware processor 1202 during execution thereof by the machine 1200. In an example, one or any combination of the hardware processor 1202, the main memory 1204, the static memory 1206, or the storage device 1216 may constitute machine readable media.

While the machine readable medium 1222 is illustrated as a single medium, the term "machine readable medium" may include a single medium or multiple media (e.g., a centralized or distributed database, and/or associated caches and servers) configured to store the one or more instructions 1224.

The term "machine readable medium" may include any medium that is capable of storing, encoding, or carrying instructions for execution by the machine 1200 and that cause the machine 1200 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1224 may further be transmitted or received over a communications network 1226 using a transmission medium via the network interface device 1220 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1220 may include one or more physical jacks (e.g., Ethernet, coaxial, or phone jacks) or one or more antennas to connect to the communications network 1226. In an example, the network interface device 1220 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1200, and includes digital or analog communications signals or other intangible medium to facilitate communication of such software.

ADDITIONAL NOTES AND EXAMPLES

Examples may include subject matter such as a method, means for performing acts of the method, at least one machine-readable medium including instructions that, when performed by a machine cause the machine to performs acts of the method, or of an apparatus or system for detecting anomalies in analog circuits, according to embodiments and examples described herein.

Example 1 is a system for detecting anomalies in an analog circuit, comprising: memory to store instructions to operate an anomaly detection model running one or more machine learning models; a processor coupled to the memory to execute the instructions to cause the anomaly detection model to: access runtime design-for-feature (DFx) signal data from an in-field detector on an analog component, the DFx signal data collected based on functional input or test control signals to the analog component; analyze the DFx signal data using at least one of a point anomaly detector, a contextual anomaly detector, or a collective anomaly detector; generate an anomaly score based on results of the analyzing; compare the anomaly score to a pre-selected threshold; and trigger a functional safety action for the analog component in response to a result of the comparison indicating that the anomaly score traverses the threshold.

In Example 2, the subject matter of Example 1 includes, wherein the DFx signal data is analyzed using the point anomaly detector, the point anomaly detector identifying individual spikes in the DFx signal data using a first trained machine learning model.

In Example 3, the subject matter of Example 2 includes, wherein the DFx signal data is analyzed using the contextual anomaly detector, the contextual anomaly detector identifying a data instance in the DFx signal data as being anomalous in a specific context, under pre-defined conditions, including identifying a trend anomaly in the DFx signal data, wherein the trend anomaly is a data instance that is in violation of an identified trend, using a second trained machine learning model.

In Example 4, the subject matter of Example 3 includes, wherein the DFx signal data is analyzed using the collective anomaly detector, the collective anomaly detector identifying a collection of data instances that are anomalous with respect to the DFx signal data set in a selected time range, using a third trained machine learning model, and wherein the collection of data instances includes groups of features, and wherein features are correlated within a same feature group and are independent between groups of the groups of features.

In Example 5, the subject matter of Example 4 includes, wherein the first, second, and third trained machine learning models are combined into one or more hybrid machine learning models, and wherein anomalies detected using the one or more hybrid machine learning models are aggregated to generate the anomaly score.

In Example 6, the subject matter of Examples 1-5 includes, wherein the processor is further to operate model update logic to: receive a federated update to the one or more machine learning models, from a cloud service; dynamically train the one or more machine learning models using the DFx signal data; and provide a model update to the cloud service for aggregation with model updates from other systems.

In Example 7, the subject matter of Examples 1-6 includes, wherein the DFx signal data is provided in a timestamped format over a time-series.

In Example 8, the subject matter of Example 7 includes, wherein to compare the anomaly score to the threshold, the anomaly detection model is further to use values and a trend of the anomaly score over the time-series to determine the functional safety action.

In Example 9, the subject matter of Examples 1-8 includes, wherein to analyze the DFx signal data, the anomaly detection model is further to apply a covariate adjustment to the DFx signal data, the covariate adjustment including an adjustment to the DFx signal data based on a baseline ambient temperature, a baseline environmental humidity, or a date of measurement.

Example 10 is a computer implemented method for detecting anomalies in an analog circuitry, comprising: accessing runtime design-for-feature (DFx) signal data from an in-field detector on an analog component, the DFx signal data collected based on functional input or test control signals to the analog component; analyzing the DFx signal data using at least one of a point anomaly detector, a contextual anomaly detector, or a collective anomaly detector, generating an anomaly score based on results of the analyzing; comparing the anomaly score to a pre-selected threshold; and triggering a functional safety action for the analog component in response to a result of the comparison indicating that the anomaly score traverses the threshold.

In Example 11, the subject matter of Example 10 includes, wherein analyzing the DFx signal data includes using the point anomaly detector, the point anomaly detector identifying individual spikes in the DFx signal data using a first trained machine learning model.

In Example 12, the subject matter of Example 11 includes, wherein analyzing the DFx signal data includes using the contextual anomaly detector, the contextual anomaly detector identifying a data instance in the DFx signal data as being anomalous in a specific context, under pre-defined conditions, including identifying a trend anomaly in the DFx signal data, wherein the trend anomaly is a data instance that is in violation of an identified trend, using a second trained machine learning model.

In Example 13, the subject matter of Example 12 includes, wherein analyzing the DFx signal data includes using the collective anomaly detector, the collective anomaly detector identifying a collection of data instances that are anomalous with respect to the DFx signal data set in a selected time range, using a third trained machine learning model, and wherein the collection of data instances includes groups of features, and wherein features are correlated within a same feature group and are independent between groups of the groups of features.

In Example 14, the subject matter of Example 13 includes, wherein the first, second, and third trained machine learning models are combined into one or more hybrid machine learning models, and further comprising aggregating anomalies detected using the one or more hybrid machine learning models to generate the anomaly score.

In Example 15, the subject matter of Examples 10-14 includes, receiving a federated update to the one or more machine learning models, from a cloud service; dynamically training the one or more machine learning models using the DFx signal data; and providing a model update to the cloud service for aggregation with model updates from other systems.

In Example 16, the subject matter of Examples 10-15 includes, wherein the DFx signal data is provided in a timestamped format over a time-series.

In Example 17, the subject matter of Example 16 includes, wherein comparing the anomaly score to the threshold includes using values and a trend of the anomaly score over the time-series to determine the functional safety action.

In Example 18, the subject matter of Examples 10-17 includes, wherein analyzing the DFx signal data includes applying a covariate adjustment to the DFx signal data, the covariate adjustment including an adjustment to the DFx signal data based on a baseline ambient temperature, a baseline environmental humidity, or a date of measurement.

Example 19 is at least one non-transitory machine-readable medium including instructions for detecting anomalies in an analog circuitry, which, when executed by a processor, cause the processor to perform operations to: access runtime design-for-feature (DFx) signal data from an in-field detector on an analog component, the DFx signal data collected based on functional input or test control signals to the analog component; analyze the DFx signal data using at least one of a point anomaly detector, a contextual anomaly detector, or a collective anomaly detector; generate an anomaly score based on results of the analyzing; compare the anomaly score to a pre-selected threshold; and trigger a functional safety action for the analog component in response to a result of the comparison indicating that the anomaly score traverses the threshold.

In Example 20, the subject matter of Example 19 includes, wherein the instructions further cause the processor to: receive a federated update to the one or more machine learning models, from a cloud service; dynamically train the one or more machine learning models using the DFx signal data; and provide a model update to the cloud service for aggregation with model updates from other systems.

In Example 21, the subject matter of Examples 19-20 includes, wherein the DFx signal data is provided in a timestamped format over a time-series, and wherein to compare the anomaly score to the threshold, the instructions further cause the processor to use values and a trend of the anomaly score over the time-series to determine the functional safety action.

In Example 22, the subject matter of Examples 19-21 includes, wherein to analyze the DFx signal data, the instructions further cause the processor to apply a covariate adjustment to the DFx signal data, the covariate adjustment including an adjustment to the DFx signal data based on a baseline ambient temperature, a baseline environmental humidity, or a date of measurement.

Example 23 is at least one machine-readable medium including instructions that, when executed by processing circuitry, cause the processing circuitry to perform operations to implement of any of Examples 1-22.

Example 24 is an apparatus comprising means to implement of any of Examples 1-22.

Example 25 is a system to implement of any of Examples 1-22.

Example 26 is a method to implement of any of Examples 1-22.

The techniques described herein are not limited to any particular hardware or software configuration; they may find applicability in any computing, consumer electronics, or processing environment. The techniques may be implemented in hardware, software, firmware or a combination, resulting in logic or circuitry which supports execution or performance of embodiments described herein.

For simulations, program code may represent hardware using a hardware description language or another functional description language which essentially provides a model of how designed hardware is expected to perform. Program code may be assembly or machine language, or data that may be compiled and/or interpreted. Furthermore, it is common in the art to speak of software, in one form or another as taking an action or causing a result. Such expressions are merely a shorthand way of stating execution of program code by a processing system which causes a processor to perform an action or produce a result.

Each program may be implemented in a high level procedural, declarative, and/or object-oriented programming language to communicate with a processing system. However, programs may be implemented in assembly or machine language, if desired. In any case, the language may be compiled or interpreted.

Program instructions may be used to cause a general-purpose or special-purpose processing system that is programmed with the instructions to perform the operations described herein. Alternatively, the operations may be performed by specific hardware components that contain hardwired logic for performing the operations, or by any combination of programmed computer components and custom hardware components. The methods described herein may be provided as a computer program product, also described as a computer or machine accessible or readable medium that may include one or more machine accessible storage media having stored thereon instructions that may be used to program a processing system or other electronic device to perform the methods.

Program code, or instructions, may be stored in, for example, volatile and/or non-volatile memory, such as storage devices and/or an associated machine readable or machine accessible medium including solid-state memory, hard-drives, floppy-disks, optical storage, tapes, flash memory, memory sticks, digital video disks, digital versatile discs (DVDs), etc., as well as more exotic mediums such as machine-accessible biological state preserving storage. A machine readable medium may include any mechanism for storing, transmitting, or receiving information in a form readable by a machine, and the medium may include a tangible medium through which electrical, optical, acoustical or other form of propagated signals or carrier wave encoding the program code may pass, such as antennas, optical fibers, communications interfaces, etc. Program code may be transmitted in the form of packets, serial data, parallel data, propagated signals, etc., and may be used in a compressed or encrypted format.

Program code may be implemented in programs executing on programmable machines such as mobile or stationary computers, personal digital assistants, smart phones, mobile Internet devices, set top boxes, cellular telephones and pagers, consumer electronics devices (including DVD players, personal video recorders, personal video players, satellite receivers, stereo receivers, cable TV receivers), and other electronic devices, each including a processor, volatile and/or non-volatile memory readable by the processor, at least one input device and/or one or more output devices. Program code may be applied to the data entered using the input device to perform the described embodiments and to generate output information. The output information may be applied to one or more output devices. One of ordinary skill in the art may appreciate that embodiments of the disclosed subject matter can be practiced with various computer system configurations, including multiprocessor or multiple-core processor systems, minicomputers, mainframe computers, as well as pervasive or miniature computers or processors that may be embedded into virtually any device. Embodiments of the disclosed subject matter can also be practiced in distributed computing environments, cloud environments, peer-to-peer or networked microservices, where tasks or portions thereof may be performed by remote processing devices that are linked through a communications network.

A processor subsystem may be used to execute the instruction on the machine-readable or machine accessible media. The processor subsystem may include one or more processors, each with one or more cores. Additionally, the processor subsystem may be disposed on one or more physical devices. The processor subsystem may include one or more specialized processors, such as a graphics processing unit (GPU), a digital signal processor (DSP), a field programmable gate array (FPGA), or a fixed function processor.

Although operations may be described as a sequential process, some of the operations may in fact be performed in parallel, concurrently, and/or in a distributed environment, and with program code stored locally and/or remotely for access by single or multi-processor machines. In addition, in some embodiments the order of operations may be rearranged without departing from the spirit of the disclosed subject matter. Program code may be used by or in conjunction with embedded controllers.

Examples, as described herein, may include, or may operate on, circuitry, logic or a number of components, modules, or mechanisms. Modules may be hardware, software, or firmware communicatively coupled to one or more processors in order to carry out the operations described herein. It will be understood that the modules or logic may be implemented in a hardware component or device, software or firmware running on one or more processors, or a combination. The modules may be distinct and independent components integrated by sharing or passing data, or the modules may be subcomponents of a single module, or be split among several modules. The components may be processes running on, or implemented on, a single compute node or distributed among a plurality of compute nodes running in parallel, concurrently, sequentially or a combination, as described more fully in conjunction with the flow diagrams in the figures. As such, modules may be hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured, arranged or adapted by using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

What is claimed is:

1. A system for detecting anomalies in an analog circuit, comprising:
   memory to store instructions to operate an anomaly detection model running one or more machine learning models;
   a processor coupled to the memory to execute the instructions to cause the anomaly detection model to:
      access a runtime signal data from an in-field detector on an analog component, wherein the runtime signal data is functional signal data or design for feature (DFx) signal data, the functional signal data or the DFx signal data collected based on functional input or test control signals to the analog component;
      analyze the functional signal data or the DFx signal data using at least one of a point anomaly detector, a contextual anomaly detector, or a collective anomaly detector;
      generate an anomaly score based on results of the analyzing;
      compare the anomaly score to a pre-selected threshold; and
      trigger a functional safety action for the analog component in response to a result of the comparison indicating that the anomaly score traverses the threshold.

2. The system as recited in claim 1, wherein the functional signal data or the DFx signal data is analyzed using the point anomaly detector, the point anomaly detector identifying individual spikes in the functional signal data or the DFx signal data using a first trained machine learning model.

3. The system as recited in claim 2, wherein the functional signal data or the DFx signal data is analyzed using the contextual anomaly detector, the contextual anomaly detector identifying a data instance in the functional signal data or the DFx signal data as being anomalous in a specific context, under pre-defined conditions, including identifying a trend anomaly in the functional signal data or the DFx signal data, wherein the trend anomaly is a data instance that is in violation of an identified trend, using a second trained machine learning model.

4. The system as recited in claim 3, wherein the functional signal data or the DFx signal data is analyzed using the collective anomaly detector, the collective anomaly detector identifying a collection of data instances that are anomalous with respect to the functional signal data or the DFx signal data set in a selected time range, using a third trained machine learning model, and wherein the collection of data instances includes groups of features, and wherein features are correlated within a same feature group and are independent between groups of the groups of features.

5. The system as recited in claim 4, wherein the first, second, and third trained machine learning models are combined into one or more hybrid machine learning models, and wherein anomalies detected using the one or more hybrid machine learning models are aggregated to generate the anomaly score.

6. The system as recited in claim 1, wherein the processor is further to operate model update logic to:
  receive a federated update to the one or more machine learning models, from a cloud service;
  dynamically train the one or more machine learning models using the functional signal data or the DFx signal data; and
  provide a model update to the cloud service for aggregation with model updates from other systems.

7. The system as recited in claim 1, wherein the functional signal data or the DFx signal data is provided in a time-stamped format over a time-series.

8. The system as recited in claim 7, wherein to compare the anomaly score to the threshold, the anomaly detection model is further to use values and a trend of the anomaly score over the time-series to determine the functional safety action.

9. The system as recited in claim 1, wherein to analyze the functional signal data or the DFx signal data, the anomaly detection model is further to apply a covariate adjustment to the functional signal data or the DFx signal data, the covariate adjustment including an adjustment to the functional signal data or the DFx signal data based on a baseline ambient temperature, a baseline environmental humidity, or a date of measurement.

10. A computer implemented method for detecting anomalies in an analog circuitry, comprising:
  accessing a runtime signal data from an in-field detector on an analog component, wherein the runtime signal data is functional signal data or design for feature (DFx) signal data, the functional signal data or the DFx signal data collected based on functional input or test control signals to the analog component;
  analyzing the functional signal data or the DFx signal data using at least one of a point anomaly detector, a contextual anomaly detector, or a collective anomaly detector;
  generating an anomaly score based on results of the analyzing;
  comparing the anomaly score to a pre-selected threshold; and
  triggering a functional safety action for the analog component in response to a result of the comparison indicating that the anomaly score traverses the threshold.

11. The method as recited in claim 10, wherein analyzing the functional signal data or DFx signal data includes using the point anomaly detector, the point anomaly detector identifying individual spikes in the functional signal data or the DFx signal data using a first trained machine learning model.

12. The method as recited in claim 11, wherein analyzing the functional signal data or the DFx signal data includes using the contextual anomaly detector, the contextual anomaly detector identifying a data instance in the functional signal data or the DFx signal data as being anomalous in a specific context, under pre-defined conditions, including identifying a trend anomaly in the DFx signal data, wherein the trend anomaly is a data instance that is in violation of an identified trend, using a second trained machine learning model.

13. The method as recited in claim 12, wherein analyzing the functional signal data or the DFx signal data includes using the collective anomaly detector, the collective anomaly detector identifying a collection of data instances that are anomalous with respect to the functional signal data or the DFx signal data set in a selected time range, using a third trained machine learning model, and wherein the collection of data instances includes groups of features, and wherein features are correlated within a same feature group and are independent between groups of the groups of features.

14. The method as recited in claim 13, wherein the first, second, and third trained machine learning models are combined into one or more hybrid machine learning models, and further comprising aggregating anomalies detected using the one or more hybrid machine learning models to generate the anomaly score.

15. The method as recited in claim 10, further comprising:
  receiving a federated update to the one or more machine learning models, from a cloud service;
  dynamically training the one or more machine learning models using the functional signal data or the DFx signal data; and
  providing a model update to the cloud service for aggregation with model updates from other systems.

16. The method as recited in claim 10, wherein the functional signal data or the DFx signal data is provided in a timestamped format over a time-series.

17. The method as recited in claim 16, wherein comparing the anomaly score to the threshold includes using values and a trend of the anomaly score over the time-series to determine the functional safety action.

18. The method as recited in claim 10, wherein analyzing the functional signal data or DFx signal data includes applying a covariate adjustment to the functional signal data or the DFx signal data, the covariate adjustment including an adjustment to the functional signal data or the DFx signal data based on a baseline ambient temperature, a baseline environmental humidity, or a date of measurement.

19. At least one non-transitory machine-readable medium including instructions for detecting anomalies in an analog circuitry, which, when executed by a processor, cause the processor to perform operations to:
  access a runtime signal data from an in-field detector on an analog component, wherein the runtime signal data is functional signal data or design for feature (DFx) signal data, the functional signal data or the DFx signal data collected based on functional input or test control signals to the analog component;
  analyze the functional signal data or the DFx signal data using at least one of a point anomaly detector, a contextual anomaly detector, or a collective anomaly detector;
  generate an anomaly score based on results of the analyzing;
  compare the anomaly score to a pre-selected threshold; and
  trigger a functional safety action for the analog component in response to a result of the comparison indicating that the anomaly score traverses the threshold.

20. The at least one machine-readable medium as recited in claim 19, wherein the instructions further cause the processor to:
  receive a federated update to the one or more machine learning models, from a cloud service;
  dynamically train the one or more machine learning models using the functional signal data or the DFx signal data; and
  provide a model update to the cloud service for aggregation with model updates from other systems.

21. The at least one machine-readable medium as recited in claim 19, wherein the DFx signal data is provided in a timestamped format over a time-series, and wherein to compare the anomaly score to the threshold, the instructions further cause the processor to use values and a trend of the anomaly score over the time-series to determine the functional safety action.

22. The at least one machine-readable medium as recited in claim 19, wherein to analyze the functional signal data or the DFx signal data, the instructions further cause the processor to apply a covariate adjustment to the functional signal data or the DFx signal data, the covariate adjustment including an adjustment to the functional signal data or the DFx signal data based on a baseline ambient temperature, a baseline environmental humidity, or a date of measurement.

* * * * *